United States Patent
Nanba et al.

(10) Patent No.: US 8,883,313 B2
(45) Date of Patent: Nov. 11, 2014

(54) MODIFIED POLYTETRAFLUOROETHYLENE POWDER AND METHOD FOR PRODUCING TETRAFLUOROETHYLENE POLYMER

(75) Inventors: Yoshinori Nanba, Settsu (JP); Yasuhiko Sawada, Settsu (JP); Shunji Kasai, Settsu (JP); Shuji Tagashira, Settsu (JP); Makoto Ono, Settsu (JP); Takahiro Taira, Settsu (JP); Hiroyuki Yoshimoto, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 543 days.

(21) Appl. No.: 11/547,557

(22) PCT Filed: Apr. 4, 2005

(86) PCT No.: PCT/JP2005/006599
§ 371 (c)(1),
(2), (4) Date: Oct. 5, 2006

(87) PCT Pub. No.: WO2005/097847
PCT Pub. Date: Oct. 20, 2005

(65) Prior Publication Data
US 2008/0281067 A1    Nov. 13, 2008

(30) Foreign Application Priority Data
Apr. 7, 2004    (JP) ................ 2004-113639

(51) Int. Cl.
C08F 259/08    (2006.01)
C08F 214/26    (2006.01)
C08F 14/26    (2006.01)
H05K 1/03    (2006.01)
H05K 1/02    (2006.01)

(52) U.S. Cl.
CPC ............ *C08F 214/26* (2013.01); *C08F 259/08* (2013.01); *C08F 14/26* (2013.01); *C08F 214/262* (2013.01); *H05K 1/024* (2013.01); *H05K 1/0373* (2013.01); *H05K 2201/015* (2013.01); *H05K 2201/0212* (2013.01)

USPC .......... 428/421; 525/276; 526/247; 526/250; 526/253; 526/254; 526/255; 523/201

(58) Field of Classification Search
CPC ...................................... C08F 259/08
USPC .......................... 526/247; 523/201
See application file for complete search history.

(56) References Cited

U.S. PATENT DOCUMENTS

| | | | | |
|---|---|---|---|---|
| 3,635,926 | A * | 1/1972 | Gresham et al. | 526/206 |
| 4,134,995 | A | 1/1979 | Fumoto et al. | |
| 4,391,940 | A | 7/1983 | Kuhls et al. | |
| 4,908,410 | A * | 3/1990 | Malhotra | 525/276 |
| 5,284,708 | A * | 2/1994 | Shimizu et al. | 428/402 |
| 5,731,394 | A | 3/1998 | Treat et al. | |
| 6,011,113 | A * | 1/2000 | Konabe | 524/805 |
| 6,395,848 | B1 * | 5/2002 | Morgan et al. | 526/214 |
| 6,541,589 | B1 * | 4/2003 | Baillie | 526/250 |
| 7,129,298 | B2 | 10/2006 | Ono et al. | |
| 7,498,392 | B2 * | 3/2009 | Nelson | 526/250 |
| 2003/0011958 | A1 * | 1/2003 | Kolmschlag et al. | 361/302 |
| 2004/0236047 | A1 * | 11/2004 | Ono et al. | 526/247 |

FOREIGN PATENT DOCUMENTS

| | | |
|---|---|---|
| EP | 0 257 644 A2 | 3/1988 |
| EP | 0 919 575 A1 | 6/1999 |
| EP | 1 422 258 A1 | 5/2004 |
| EP | 1 512 721 A1 | 3/2005 |
| EP | 1 568 720 A1 | 8/2005 |
| EP | 1 661 947 A1 | 5/2006 |
| JP | 51-130494 A | 11/1976 |
| JP | 52-005890 A | 1/1977 |
| JP | 56-92943 A | 7/1981 |
| JP | 11-509245 A | 8/1999 |
| JP | 2001-288227 A | 10/2001 |
| JP | 2002-47315 A | 2/2002 |
| WO | WO 97/02301 A1 | 1/1997 |

* cited by examiner

*Primary Examiner* — Nicole M Buie-Hatcher
(74) *Attorney, Agent, or Firm* — Sughrue Mion, PLLC

(57) ABSTRACT

The present invention provides a polytetrafluoroethylene powder having moldability/processability as well as electrical characteristics in microwave bands. The present invention is a modified polytetrafluoroethylene powder which has (1) a dielectric loss tangent at 12 GHz of not higher than $2.0 \times 10^{-4}$ and (2) a cylinder extrusion pressure of not higher than 45 MPa at a reduction ratio of 1600.

7 Claims, No Drawings

MODIFIED POLYTETRAFLUOROETHYLENE POWDER AND METHOD FOR PRODUCING TETRAFLUOROETHYLENE POLYMER

TECHNICAL FIELD

The present invention relates to a modified polytetrafluoroethylene powder, a polytetrafluoroethylene powder, a modified tetrafluoroethylene aqueous dispersion, a molded article and a method of producing a polytetrafluoroethylene polymer.

BACKGROUND ART

The development of means of communication utilizing radio waves is remarkable. For example, while the UHF bands up to the frequency 300 MHz are currently used in wireless LANs and cellular phones, high-frequency LAN, satellite communication and cellular phone base stations, which will be the central targets of future development, will use microwave bands in the range of 3 to 30 GHz and there is a tendency for higher frequency bands to be used with the increase in amount of information.

In the case of using high frequency bands, fluororesins, which are excellent in electrical characteristics, namely stably low in dielectric constant [$\in_r$] and low in dielectric loss constant [tan δ], have been regarded as appropriate and used as insulating materials or dielectric materials for use in connectors or like parts for electrical products, or in communication apparatus such as coaxial cables.

Known as fluororesins used in communications apparatus are tetrafluoroethylene homopolymers as well as such melt-processable polymers as tetrafluoroethylene [TFE]/hexafluoropropylene [HFP] copolymers [FEP; HFP content not lower than 6.9 mole percent] and TFE/perfluoro(alkyl vinyl ether) [PAVE] copolymers [PFA; PAVE content not lower than 1.5 mole percent].

However, when tetrafluoroethylene homopolymers are used, molding/processing tends to become difficult and, when melt-processable polymers are used, there is a problem, namely the electrical characteristics tend to deteriorate. Therefor, it has become necessary that fluororesins have good moldability/processability as well as good electrical characteristics; thus, various fluoropolymers have been proposed.

A non-melt-processable modified PTFE fine powder obtainable by copolymerizing TFE and a very small amount of a PAVE or a fluoroolefin has been disclosed as one requiring only a low extrusion pressure and showing great strength of bonding to wires (cf. e.g. Patent Document 1: Japanese Kohyo Publication H11-509245). However, this modified PTFE fine powder has a problem, namely it is inferior in electrical characteristics.

Known as ones improved in electrical characteristics are a TFE-based resin as a molding material which is a copolymerization product derived from TFE and a very small amount of a perfluoromonomer and has a core-shell structure (cf. e.g. Patent Document 2: Japanese Kokai Publication 2001-288227), and a TFE-based resin as a molding material which has a reduced dielectric loss tangent value as a result of molecular weight reduction (cf. e.g. Patent Document 3: Japanese Kokai Publication 2002-47315), respectively. However, these documents have neither descriptions nor suggestions about the relationship between the use of a chain transfer agent and the moldability/processability of the resulting resins.

An aqueous dispersion containing colloidal particles of a TFE polymer having a three-layer structure composed of a particle core, an inner particle covering layer and an outer particle covering (cf. e.g. Patent Document 4: Japanese Kokai Publication S56-92943). While this document describes that propane, methanol or the like can be used as a chain transfer agent, it is a problem that moldability/processability and electrical characteristics cannot coexist.

DISCLOSURE OF INVENTION

Problems which the Invention is to Solve

In view of the above-discussed state of the art, it is an object of the present invention to provide a polytetrafluoroethylene powder having good moldability/processability as well as good electrical characteristics in microwave bands.

Means for Solving the Problems

The present invention is a modified polytetrafluoroethylene powder which has (1) a dielectric loss tangent at 12 GHz of not higher than $2.0 \times 10^{-4}$ and (2) a cylinder extrusion pressure of not higher than 45 MPa at a reduction ratio of 1600.

The present invention is a method of producing a tetrafluoroethylene polymer which contains step (1) charging a reaction system in the initial stage of polymerization reaction with a fluoroolefin represented by the general formula (I):

$$CX^1X^2=CX^3(CF_2)_{n1}F \quad (I)$$

(wherein $X^1$, $X^2$ and $X^3$ each represents hydrogen atom or fluorine atom and at least one of them represents fluorine atom, and n1 represents an integer of 1 to 5), a fluoro(alkyl vinyl ether) represented by the general formula (II):

$$F_2C=CFO(CF_2)_{n2}X^4 \quad (II)$$

(wherein $X^4$ represents hydrogen atom or fluorine atom and n2 represents an integer of 1 to 6) and/or a vinylic heterocyclic compound represented by the general formula (III):

(wherein $X^5$ and $X^6$ are the same or different and each represents hydrogen atom or fluorine atom and Y represents $-CR^1R^2-$ in which $R^1$ and $R^2$ are the same or different and each represents fluorine atom, an alkyl group containing 1 to 6 carbon atoms or a fluoroalkyl group containing 1 to 6 carbon atoms), initiating the polymerization reaction and carrying out the polymerization reaction until the conversion of tetrafluoroethylene amounts to at least 50%, and step (2), which follows the step (1) introducing a fluoroolefin represented by the general formula (I):

$$CX^1X^2=CX^3(CF_2)_{n1}F \quad (I)$$

(wherein $X^1$, $X^2$ and $X^3$ each represents hydrogen atom or fluorine atom and at least one of them represents fluorine atom, and n1 represents an integer of 1 to 5), a fluoro(alkyl vinyl ether) represented by the general formula (II):

$$F_2C=CFO(CF_2)_{n2}X^4 \quad (II)$$

(wherein $X^4$ represents hydrogen atom or fluorine atom and n2 represents an integer of 1 to 6) and/or a vinylic heterocyclic compound represented by the general formula (III):

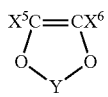

(wherein $X^5$ and $X^6$ are the same or different and each represents hydrogen atom or fluorine atom and Y represents —$CR^1R^2$— in which $R^1$ and $R^2$ are the same or different and each represents fluorine atom, an alkyl group containing 1 to 6 carbon atoms or a fluoroalkyl group containing 1 to 6 carbon atoms), together with a chain transfer agent, into the reaction system, the chain transfer agent being a hydrocarbon and/or a fluorohydrocarbon, the tetrafluoroethylene polymer constituting a particle core and a particle shell, the particle core constituting less than 95% by mass of the tetrafluoroethylene polymer and containing a fluoroolefin unit derived from the fluoroolefin represented by the general formula (I), a fluoro(alkyl vinyl ether) unit derived from the fluoro(alkyl vinyl ether) represented by the general formula (II) and a vinylic heterocyclic compound unit derived from the vinylic heterocyclic compound represented by the general formula (III) at a total content level of α% by mass relative to the tetrafluoroethylene polymer, the particle shell constituting 5 to 50% by mass of the tetrafluoroethylene polymer and containing a fluoroolefin unit derived from the fluoroolefin represented by the general formula (I), a fluoro(alkyl vinyl ether) unit derived from the fluoro(alkyl vinyl ether) represented by the general formula (II) and a vinylic heterocyclic compound unit derived from the vinylic heterocyclic compound represented by the general formula (III) at a total content level of 1% by mass relative to the tetrafluoroethylene polymer, the α and the β satisfying the following relations (A), (B) and (C)

(A) $0.01 \le \alpha+\beta \le 0.1$
(B) $0.0001 \le \alpha < 0.1$
(C) $0.0001 \le \beta < 0.1$.

The present invention is a modified polytetrafluoroethylene powder which comprises a tetrafluoroethylene polymer produced by the above-defined method of a tetrafluoroethylene polymer.

The present invention is a modified polytetrafluoroethylene aqueous dispersion, wherein a particle comprising a tetrafluoroethylene polymer produced by the above-defined method of a tetrafluoroethylene polymer is dispersed in an aqueous medium.

The present invention is an additive for a resin which comprises the above-defined modified polytetrafluoroethylene powder and the above-defined modified polytetrafluoroethylene aqueous dispersion.

The present invention is a molded article which is obtained by molding/processing the above-defined modified polytetrafluoroethylene powder and the above-defined modified polytetrafluoroethylene aqueous dispersion.

The present invention is a molding material obtained by the above-defined modified polytetrafluoroethylene powder and the above-defined modified polytetrafluoroethylene aqueous dispersion, the molding material being used as or in a cable covering, an electric wire covering, a printed circuit board, a tube or a yarn.

In the following, the present invention is described in detail.

The modified polytetrafluoroethylene powder of the invention has (1) a dielectric loss tangent at 12 GHz is not higher than $2.0 \times 10^{-4}$. The dielectric loss tangent at 12 GHz can be as low as $1.72 \times 10^{-4}$, for instance.

The "dielectric loss tangent" so referred to herein is the value obtained by measuring a film-shaped specimen for changes in resonance frequency and electric field strength at a temperature of 20 to 25° C. using a cavity resonator. When measurements are carried out using a cavity resonator, the resonance frequency decreases as compared with 12 GHz, and the dielectric constant and dielectric loss tangent obtained are expressed herein in terms of respective values under no load frequency conditions. The film-shaped specimen is prepared by compression molding the modified polytetrafluoroethylene powder into a cylinder, slicing off a film from the cylinder, baking the film at 380° C. for 5 minutes, gradually cooling the same to 250° C. at a cooling rate of 60° C./hour, maintaining the same at 250° C. for 5 minutes and then allowing the same to cool to ordinary temperature.

If the dielectric loss tangent at 12 GHz is within the range specified above, good transmission characteristics as a dielectric material for coaxial cables or like transmission products can be attained in microwave bands (3 to 30 GHz) or UHF very ultrahigh frequency bands (<3 GHz).

The modified polytetrafluoroethylene powder of the invention has (1) a dielectric loss tangent at 12 GHz within the above range and, in addition, requires (2) a cylinder extrusion pressure of not higher than 45 MPa at a reduction ratio of 1600. A preferred upper limit to the cylinder extrusion pressure at a reduction ratio of 1600 is 35 MPa. The cylinder extrusion pressure for the modified polytetrafluoroethylene powder at a reduction ratio of 1600 can be lowered, for example, to 22.9 MPa within the range mentioned above. A cylinder extrusion pressure within the above-mentioned range at a reduction ratio of 1600 can be attained by adjusting the level of addition of the chain transfer agent and/or the specific degree of modification in the method of producing a tetrafluoroethylene polymer of the invention, which is to be described later herein.

The "cylinder extrusion pressure" so referred to herein is the value measured at a reduction ratio of 1600 following addition of 21 parts by mass of a hydrocarbon oil (trademark: Isopar G, product of Exxon Chemical Company) as an extrusion aid to 100 parts by mass of the modified polytetrafluoroethylene powder in question.

When the cylinder extrusion pressure at a reduction ratio of 1600 is within the range specified above, the powder can be successfully molded even under such conditions that the reduction ratio is 3000 or higher and, for example, it can give small-diameter high-frequency coaxial cables, which are to be described later herein, and thus is advantageous from the productivity viewpoint as well.

The "modified polytetrafluoroethylene powder" so referred to herein is a resin powder comprising a modified polytetrafluoroethylene [modified PTFE].

The modified polytetrafluoroethylene powder preferably comprises particles comprising a modified PTFE which constitute the modified polytetrafluoroethylene powder. More preferably, the particles are constituted of a segment made of a modified PTFE and a segment made of a tetrafluoroethylene homopolymer [TFE homopolymer]. The term "particles" as used herein means particles constituting a mass of very small fine pieces or grains, namely a powder, or the like.

The modified PTFE constituting the modified polytetrafluoroethylene powder of the invention is a fluoropolymer obtained by copolymerization of tetrafluoroethylene [TFE] and a very small amount of a monomer other than TFE.

The modified PTFE is preferably a tetrafluoroethylene copolymer obtained by polymerizing TFE and an olefinic comonomer copolymerizable with TFE.

The olefinic comonomer preferably comprises a fluoroolefin represented by the general formula (I):

$$CX^1X^2\!=\!CX^3(CF_2)_{n1}F \quad (I)$$

(wherein $X^1$, $X^2$ and $X^3$ each represents hydrogen atom or fluorine atom and at least one of them represents a fluorine atom, and n1 represents an integer of 1 to 5), a fluoro(alkyl vinyl ether) represented by the general formula (II):

$$F_2C\!=\!CFO(CF_2)_{n2}X^4 \quad (II)$$

(wherein $X^4$ represents hydrogen atom or fluorine atom and n2 represents an integer of 1 to 6) and/or a vinylic heterocyclic compound represented by the general formula (III):

(wherein $X^5$ and $X^6$ are the same or different and each represents hydrogen atom or fluorine atom and Y represents —$CR^1R^2$— in which $R^1$ and $R^2$ are the same or different and each represents fluorine atom, an alkyl group containing 1 to 6 carbon atoms or a fluoroalkyl group containing 1 to 6 carbon atoms).

As the fluoroolefin represented by the general formula (I), there may be mentioned perfluoroolefins such as hexafluoropropylene [HFP]; and hydrogen-containing fluoroolefins such as (perfluorobutyl)ethylene. From the electrical characteristics viewpoint, perfluoroolefins are preferred and, among them, HFP is preferred since modified PTFE species obtained by using HFP as a comonomer have particularly good electrical characteristics.

Preferred as the fluoro(alkyl vinyl ether) represented by the general formula (II) are those in which n2 is 1 to 4, more preferably those in which n2 is 1 to 3. Also preferred as the fluoro(alkyl vinyl ether) represented by the general formula (II) are perfluoro(alkyl vinyl ether) species in which $X^4$ is fluorine atom.

As the perfluoro(alkyl vinyl ether), there may be mentioned perfluoro (methyl vinyl ether) [PMVE], perfluoro (ethyl vinyl ether) [PEVE], perfluoro (propyl vinyl ether) [PPVE] and perfluoro (butyl vinyl ether) [PBVE], among others. Among them, PMVE is preferred because of good electrical characteristics of the modified PTFE obtainable when it is used as the comonomer.

Preferred as the vinylic heterocyclic compound represented by the general formula (III) are those in which $X^5$ and $X^6$ each is fluorine atom and $R^1$ and $R^2$ each is a fluoroalkyl group containing 1 to 6 carbon atoms. Preferred as the vinylic heterocyclic compound represented by the general formula (III) is perfluoro-2,2-dimethyl-1,3-dioxole [PDD] in which $X^5$ and $X^6$ each is fluorine atom and $R^1$ and $R^2$ each is a perfluoromethyl group.

At least one selected from among three kinds of monomers, namely those fluoroolefins represented by the general formula (I), those fluoro(alkyl vinyl ether) compounds represented by the general formula (II) and those vinylic heterocyclic compounds represented by the general formula (III) may be used as the olefinic comonomer copolymerizable with TFE. For each kind, one single compound or two or more compounds may be used.

Preferred as the olefinic monomer copolymerizable with TFE are the fluoroolefins and/or fluoro(alkyl vinyl ether) compounds.

The modified PTFE constituting the modified polytetrafluoroethylene powder of the invention is modified at a specific degree of modification by it comprising at least one unit species selected from the group consisting of fluoroolefin units derived from the fluoroolefins represented by the general formula (I), fluoro(alkyl vinyl ether) units derived from the fluoro(alkyl vinyl ether) compounds represented by the general formula (II) and vinylic heterocyclic compound units derived from the vinylic heterocyclic compounds represented by the general formula (III), and the specific degree of modification is preferably not lower than 0.01% by mass but lower than 0.1% by mass based on the tetrafluoroethylene polymer. A more preferred upper limit is 0.09% by mass and a still more preferred upper limit is 0.08% by mass.

The tetrafluoroethylene polymer constituting the modified polytetrafluoroethylene powder of the invention may be any of those comprising at least one unit species selected from the group consisting of the fluoroolefin units, fluoro(alkyl vinyl ether) units and vinylic heterocyclic compound units, and these three kinds of units each may comprise one single compound or two or more compounds. When one of the above-mentioned three kinds is used, the "specific degree of modification" so referred to herein is the value for that one kind; when two kinds are used, it is the value for the two kinds and, when all the three kinds are used, it is the value for the three kinds.

The "fluoroolefin unit" so referred to herein is a part of the molecular structure of the modified PTFE and is a segment derived from the corresponding fluoroolefin. For example, the TFE unit is a part of the molecular structure of the modified PTFE and is a TFE-derived segment and is represented by —($CF_2$—$CF_2$)—. Similarly, the fluoro(alkyl vinyl ether) unit and vinylic heterocyclic compound unit so referred to herein and other monomer units each is a part of the molecular structure of the modified PTFE and is a segment derived from the corresponding monomer.

As for the content of the haxafluoropropylene-derived hexafluoropropylene units, for instance, among the above-mentioned fluoroolefin units, the value (% by mass) obtained by multiplying the ratio between the infrared absorption band intensity at 983 cm$^{-1}$ and that at 935 cm$^{-1}$ by the factor 0.3 can also be used.

The content of the perfluoro (methyl vinyl ether)-derived perfluoro (methyl vinyl ether) units, for instance, among the fluoro(alkyl vinyl ether) units is the value obtained by determining the residual amount in the reaction system by gas chromatography and calculating the consumption by comparison with the charge. As for the content of perfluoro (propyl vinyl ether)-derived perfluoro (propyl vinyl ether) units, for instance, among the fluoro(alkyl vinyl ether) units, the value (% by mass) obtained by multiplying the ratio between the infrared absorption band intensity at 995 cm$^{-1}$ and that at 935 cm$^{-1}$ by the factor 0.14 can also be used.

As for the vinylic heterocyclic compound unit content, the value (% by mass) obtained by multiplying the ratio between the infrared absorption band intensity at 988 cm$^{-1}$ and that at 935 cm$^{-1}$ by the factor 0.1053 can also be used.

In the tetrafluoroethylene polymer constituting the modified polytetrafluoroethylene powder of the invention, the proportion of the olefinic comonomer units relative to the sum of the tetrafluoroethylene units and the olefinic comonomer units derived from the olefinic comonomer copolymerizable with TFE is preferably rather low in view of the effect of lowering the dielectric loss tangent of the moldings obtained. When the olefinic comonomer unit content in the above-mentioned polymer is high, the moldability is improved and the extrusion pressure becomes low, whereas the dipole moment increases and, therefore, the electrical characteristics tend to become inferior and, in particular, the dielectric loss tangent tends to increase.

The modified polytetrafluoroethylene powder of the invention may be any one having an extrusion pressure value and dielectric loss tangent value within the above-specified respective ranges; thus, it may not be one obtained by the method of producing a tetrafluoroethylene polymer of the invention, which is described later herein. It may comprise primary particles obtained after polymerization and before such after-treatment steps as coagulation and concentration which particles may or may not have a core-shell structure.

The modified polytetrafluoroethylene powder of the invention preferably comprises a particle core-constituting polymer amounting to less than 95% by mass of the particles constituting the modified polytetrafluoroethylene powder and a particle shell-constituting polymer amounting to 5 to 50% by mass of those particles mentioned above, both the polymers being modified PTFEs containing the same or different olefinic comonomer-derived olefinic comonomer units. The preferred species and contents of the olefinic comonomer units are as described later herein referring to the tetrafluoroethylene polymer to be obtained by the method of producing a tetrafluoroethylene polymer of the invention.

The method of polymerization for producing the tetrafluoroethylene polymer constituting the modified polytetrafluoroethylene powder of the invention is not particularly restricted but any of such techniques as emulsion polymerization, suspension polymerization, bulk polymerization and solution polymerization may be used. The use of emulsion polymerization is preferred, however. More preferably, the method of producing a tetrafluoroethylene polymer of the invention, which is to be described later herein, is used.

Generally, the modified polytetrafluoroethylene powder of the invention which has never been subjected to heating to a temperature not lower than the melting point of the tetrafluoroethylene polymer constituting the modified polytetrafluoroethylene powder has a dielectric loss tangent at 12 GHz, which is within the range mentioned above, and a cylinder extrusion pressure at a reduction ratio of 1600, which falls within the range mentioned above.

The method of producing a tetrafluoroethylene polymer of the invention comprises the following step (1) and step (2). In the method of producing a tetrafluoroethylene polymer of the invention, the step (1) is the one charging the reaction system in the initial stage of polymerization with the fluoroolefin of general formula (I), the fluoro(alkyl vinyl ether) of general formula (II) and/or the vinylic heterocyclic compound of general formula (III), initiating the polymerization reaction and carrying out the polymerization reaction until the conversion of tetrafluoroethylene amounts to at least 50%.

The tetrafluoroethylene polymer obtained in the above step (1) comprises particles each formed of a copolymer derived from TFE and the fluoroolefin of general formula (I), the fluoro(alkyl vinyl ether) of general formula (II) and/or the vinylic heterocyclic compound of general formula (III) and each serving as the particle core.

The particle core mentioned above is obtained by carrying out the polymerization reaction until the conversion of tetrafluoroethylene amounts to at least 50%.

The "conversion" so referred to herein is the percentage of the amount of TFE units consumed in the polymerization at a given time during polymerization relative to the amount of tetrafluoroethylene units to be polymerized.

The above step (1) may include a pressure releasing step. Upon pressure release, the olefinic comonomer is eliminated from the reaction system substantially wholly. When TFE is fed to the reaction system after the above-mentioned pressure release, a layer mainly consisting of tetrafluoroethylene units, preferably a layer consisting of TFE units alone, is presumably formed so as to cover the outer surface of each particle formed until the pressure release.

The step (1) preferably include step (1A) of further polymerizing tetrafluoroethylene following an intermediate pressure release at the time of the conversion ratio of tetrafluoroethylene being at 5% or higher.

The pressure release is preferably carried out at the time of arrival of the conversion of tetrafluoroethylene at a level of 10% or higher but not higher than 40%.

The pressure of the reaction system at the time of pressure release may generally amount to atmospheric pressure, namely 0.1 MPa.

In cases where, in the step (1), PMVE or a like monomer highly copolymerizable with TFE is selected as the olefinic comonomer and the whole amount of the olefinic comonomer charged at the start of polymerization is consumed fairly rapidly, it is not always necessary to carry out the above-mentioned pressure release; by causing TFE to exist in the reaction system after disappearance of the olefinic comonomer, it is possible to form a layer mainly consisting of tetrafluoroethylene units, preferably a layer consisting of TFE units alone, which covers the particle core consisting of TFE units and olefinic comonomer units. In the present specification, the step of causing TFE to exist in the reaction system after disappearance of the olefinic comonomer is included in the above-mentioned step (1) and "causing TFE to exist" may consist in continuing the polymerization of the TFE remaining in the reaction system or in feeding TFE again from outside the reaction system for polymerization according to the residual amount of TFE.

In accordance with the method of producing a tetrafluoroethylene polymer of the invention, the step (2) is the one introducing, following the above-mentioned step (1), a fluoroolefin represented by the general formula (I):

$$CX^1X^2\!=\!CX^3(CF_2)_{n1}F \qquad (I)$$

(wherein $X^1$, $X^2$ and $X^3$ each represents hydrogen atom or fluorine atom and at least one of them represents fluorine atom, and n1 represents an integer of 1 to 5), a fluoro(alkyl vinyl ether) represented by the general formula (II):

$$F_2C\!=\!CFO(CF_2)_{n2}X^4 \qquad (II)$$

(wherein $X^4$ represents hydrogen atom or fluorine atom and n2 represents an integer of 1 to 6) and/or a vinylic heterocyclic compound represented by the general formula (III):

(wherein $X^5$ and $X^6$ are the same or different and each represents hydrogen atom or fluorine atom and Y represents —$CR^1R^2$— in which $R^1$ and $R^2$ are the same or different and each represents fluorine atom, an alkyl group containing 1 to 6 carbon atoms or a fluoroalkyl group containing 1 to 6 carbon atoms), together with a chain transfer agent, into the reaction system.

In the above-mentioned step (1) and step (2), it is only necessary to use at least one kind of compound selected from among the fluoroolefins of general formula (I), the fluoro(alkyl vinyl ether) compounds of general formula (II) and the vinylic heterocyclic compounds of general formula (III); for each of the three kinds, one compound or two or more compounds may be used.

When a fluoroolefin or fluoro(alkyl vinyl ether) is used in the step (1), the fluoroolefin or fluoro(alkyl vinyl ether) to be used in the step (2) may be the same as or different from the one used in the step (1).

In the method of producing a tetrafluoroethylene polymer of the invention, the chain transfer agent is a hydrocarbon and/or a fluorohydrocarbon. The chain transfer agent may be one comprising a hydrocarbon and containing no fluorohydrocarbon, one comprising a fluorohydrocarbon and containing no hydrocarbon, or one comprising a hydrocarbon and a fluorohydrocarbon, and the hydrocarbon and fluorohydrocarbon each may comprise one species or two or more species.

The chain transfer agent preferably comprises at least one member selected from the group consisting of methane, ethane, butane, HFC-134a and HFC-32 since these occur as gases at ordinary temperature and show good dispersibility and uniformity in the reaction system. More preferably, it comprises butane.

The butane includes isobutene, n-butane and so forth, and isobutene is preferred among others. The use of propane as the chain transfer agent may lead to particle size reduction in the step of coagulation, and the use of methanol or a like compound having a polar functional group is also unfavorable.

The chain transfer agent may or may not be used in combination with the fluoroolefin of general formula (I) or fluoro (alkyl vinyl ether) of general formula (II).

The chain transfer agent may be introduced into the reaction system simultaneously with tetrafluoroethylene, the fluoroolefin of general formula (I), fluoro(alkyl vinyl ether) of general formula (II) and/or vinylic heterocyclic compound of general formula (III), or the timing of introduction may be different provided that it simultaneously exists in the reaction system at least for some time.

As a result of narrowing the focus on the balance between the electrical characteristics, in particular dielectric loss tangent, and the moldability, in particular extrusion pressure, trying to find a tolerance limit to the extrusion pressure for molding materials for coaxial cables to be used in microwave bands and groping for the proper modifier species to be copolymerized with TFE and the proper amount thereof, the proper chain transfer agent and the proper amount thereof and the proper modified structure, among others, a modified polytetrafluoroethylene powder showing a low dielectric loss tangent and requiring a low extrusion pressure as well as a tetrafluoroethylene polymer constituting that modified polytetrafluoroethylene powder was surprisingly found out. Based on such finding, the present invention has been completed.

In accordance with the method of producing a tetrafluoroethylene polymer of the invention, the tetrafluoroethylene polymer mentioned above is obtained generally as a polymer constituting a primary particle by polymerization of tetrafluoroethylene in a polymerization reaction medium. The primary particle is a polymer particle formed just after polymerization without undergoing such a subsequent step as coagulation or concentration. The primary particle is thought to have a layered structure composed of a particle core and a particle shell; thus, it can be said that the tetrafluoroethylene polymer constitutes the particle core and particle shell. The "particle core" so referred to herein constitutes less than 95% by mass of the tetrafluoroethylene polymer and includes the core of each primary particle. The particle core is obtained by carrying out the polymerization reaction until the conversion of tetrafluoroethylene amounts to at least 50%, as mentioned hereinabove, and, therefore, preferably constitutes not less than 50% by mass but less than 95% by mass of the tetrafluoroethylene polymer. The "particle shell" so referred to herein is a portion amounting to 5 to 50% by mass of the tetrafluoroethylene polymer and includes the outer surface of the tetrafluoroethylene polymer.

The particle core constituting less than 95% by mass of the tetrafluoroethylene polymer contains the fluoroolefin units derived from the fluoroolefin of general formula (I), the fluoro (alkyl vinyl ether) units derived from the fluoro(alkyl vinyl ether) of general formula (II) and the vinylic heterocyclic compound units derived from the vinylic heterocyclic compound of general formula (III) at a total content level of a % by mass relative to the tetrafluoroethylene polymer.

The "tetrafluoroethylene polymer" so referred to herein is the above-mentioned "tetrafluoroethylene polymer constituting the modified polytetrafluoroethylene powder", and the mass percentage of the olefinic comonomer units such as the above-mentioned fluoroolefin units and so forth in the above polymer can actually be determined generally as the abundance in the polytetrafluoroethylene powder as a whole. The abundance of the above-mentioned olefinic comonomer units in the above-mentioned "tetrafluoroethylene polymer" can be determined in the same manner as the abundance of the olefinic comonomer units in the above-mentioned "tetrafluoroethylene polymer constituting the modified polytetrafluoroethylene powder".

In the present specification, the mass constitution (abundance) of the olefinic comonomer units in the tetrafluoroethylene polymer is calculated from a coagulate of primary particles, secondary particles and an aggregate of secondary particles by the methods described hereinabove.

The particle core is preferably constituted of an inner particle core amounting to 5 to 90% by mass of the tetrafluoroethylene polymer and an outer particle core contacting with the outer surface of the inner particle core.

The inner particle core preferably contains the fluoroolefin units derived from the fluoroolefin of general formula (I), the fluoro(alkyl vinyl ether) units derived from the fluoro(alkyl vinyl ether) of general formula (II) and the vinylic heterocyclic compound units derived from the vinylic heterocyclic compound of general formula (III) at a total content level of $\alpha$% by mass relative to the tetrafluoroethylene polymer. Thus, the fluoroolefin units, fluoro(alkyl vinyl ether) units and vinylic heterocyclic compound units in the particle core are preferably contained in the polymer constituting the inner particle core, and the polymer constituting the outer particle core is preferably free of the fluoroolefin units derived from the fluoroolefin of general formula (I), the fluoro(alkyl vinyl ether) units derived from the fluoro(alkyl vinyl ether) of general formula (II) and the vinylic heterocyclic compound units derived from the vinylic heterocyclic compound of general formula (III).

The above-mentioned particle shell constitutes 5 to 50% by mass of the tetrafluoroethylene polymer and contains the fluoroolefin units derived from the fluoroolefin of general formula (I), the fluoro(alkyl vinyl ether) units derived from the fluoro(alkyl vinyl ether) of general formula (II) and the vinylic heterocyclic compound units derived from the vinylic heterocyclic compound of general formula (III) at a total content level of 1% by mass relative to the tetrafluoroethylene polymer.

The above-mentioned $\alpha$ and $\beta$ satisfy the following relations (A), (B) and (C).
(A) $0.01 \leq \alpha + \beta \leq 0.1$
(B) $0.0001 \leq \alpha < 0.1$
(C) $0.0001 \leq \beta < 0.1$.

According to the method of producing a tetrafluoroethylene polymer of the invention, the fluoroolefin represented by the general formula (I) the fluoro(alkyl vinyl ether) represented by the general formula (II) and/or the vinylic heterocyclic compound represented by the general formula (III) are polymerized with tetrafluoroethylene so that the above-mentioned α and β may satisfy the above relations (A), (B) and (C); as a result, a tetrafluoroethylene polymer capable of constituting a modified polytetrafluoroethylene powder showing a dielectric loss tangent at 12 GHz and a cylinder extrusion pressure at a reduction ratio of 1600 within the respective ranges mentioned above can be produced. In particular, when the sum α+β in the above-mentioned (A) is lower than 0.01, the extrusion pressure tends to become high and, when it exceeds 0.1, the electrical characteristics tend to become deteriorated.

In the above (A), a preferred lower limit to α+β is 0.05, and a preferred upper limit thereto is 0.09 and a more preferred upper limit is 0.06.

In the above (B), a preferred upper limit to α is 0.05.

In the above (C), a preferred lower limit to β is 0.02, and a preferred upper limit is 0.09 and a more preferred upper limit is 0.06.

The primary particle made of the above-mentioned tetrafluoroethylene polymer each comprises the particle core made of the modified PTFE, so that the shape of the primary particle is spherical and the sphericity thereof is high. When the particle core is made of a TFE homopolymer, the shape of the primary particle is low in sphericity and becomes rugby ball-like.

The polymerization of tetrafluoroethylene according to the method of producing a tetrafluoroethylene polymer of the invention is preferably carried in an aqueous medium.

The aqueous medium is a medium comprising water. The aqueous medium may contain, in addition to water, a polar organic solvent.

As the polar organic solvent, there may be mentioned, for example, alcohols such as methanol; nitrogen-containing solvents such as N-methylpyrrolidone [NMP]; ketones such as acetone; esters such as ethyl acetate; polar ethers such as diglyme and tetrahydrofuran [THF]; and carbonate esters such as diethylene carbonate, among others. One or a mixture of two or more of them may be used.

The aqueous medium preferably contains a water-soluble fluorine-containing dispersant.

Usable as the water-soluble fluorine-containing dispersant are nonionic surfactants, anionic surfactants, cationic surfactants and amphoteric surfactants and, among them, anionic surfactants and nonionic surfactants are preferred.

The water-soluble fluorine-containing dispersant may amount to 0.02 to 0.3% by mass relative to the aqueous medium.

The above-mentioned polymerization of tetrafluoroethylene can be carried out at 10 to 90° C. The polymerization of tetrafluoroethylene can be carried out at a pressure of 0.6 to 3 MPa.

As the polymerization initiator to be used in the polymerization of tetrafluoroethylene, there may be mentioned, for example, ammonium persulfate [APS], disuccinoyl peroxide [DSP] and the like. Among them, one or a combination of two or more species may be used.

The method of producing a tetrafluoroethylene polymer of the invention may further comprise, following the above-mentioned step (1) and step (2), a step of preparing a powder of the tetrafluoroethylene polymer by coagulation of the aqueous dispersion obtained and drying the coagulate.

The aqueous dispersion mentioned above is a dispersion of the primary particles obtained by the polymerization of tetrafluoroethylene as dispersed in the aqueous medium. The above-mentioned primary particles constitute a dispersoid as obtained after polymerization but not yet subjected to any succeeding step such as coagulation or concentration.

At the time of completion of the polymerization of tetrafluoroethylene, the solid matter content in the aqueous dispersion obtained is generally 20 to 40% by mass.

The above coagulation can be carried out by any method so far known in the art; thus, for example, an electrolyte may be added.

After the coagulation, the aqueous medium is generally removed and the coagulate obtained is dried. The drying can be carried out at 100 to 250° C., for instance.

The powder of the tetrafluoroethylene polymer obtained by the method of producing a tetrafluoroethylene polymer of the invention preferably has an average primary particle diameter of 0.05 to 0.5 μM. A more preferred lower limit is 0.1 μm, and a more preferred upper limit is 0.4 μm.

The "average primary particle diameter" so referred to herein is the value obtained in the following manner. A dispersion (solid content 0.15% by mass) is prepared by dispersing each of various tetrafluoroethylene polymer powder species in water and is placed in a cell, and the transmittance of an incident light at 550 nm is measured. Separately, the number average primary particle diameter of each polymer species is calculated by measuring diameters in a fixed direction on a transmission electron photomicrograph. A working curve is constructed based on the thus-found correlation between the transmittance and the number average primary particle diameter. Then, the average primary particle diameter value of each sample is determined based on the working curve obtained and the transmittance of the sample as measured in the same manner as mentioned above. When the polymerization of tetrafluoroethylene according to the method of producing a tetrafluoroethylene polymer of the invention is carried out in an aqueous medium, the aqueous dispersion obtained by the polymerization can be used after solid matter content adjustment.

The powder of the tetrafluoroethylene polymer obtained by the method of producing a tetrafluoroethylene polymer of the invention can be obtained as the above-mentioned modified polytetrafluoroethylene powder of the invention.

The modified polytetrafluoroethylene powder comprising the tetrafluoroethylene polymer produced by the above-mentioned tetrafluoroethylene polymer production method also constitutes an aspect of the present invention.

The modified polytetrafluoroethylene powder comprising the tetrafluoroethylene polymer produced by the method of producing a tetrafluoroethylene polymer can be obtained as one having no history of being heated at a temperature at or above the melting point of the tetrafluoroethylene polymer and showing a dielectric loss tangent at 12 GHz and a cylinder extrusion pressure at a reduction ratio of 1600 within the same respective ranges as mentioned above referring to the modified polytetrafluoroethylene powder of the invention.

The modified polytetrafluoroethylene aqueous dispersion of the invention is the one in which a particle comprising the tetrafluoroethylene polymer produced by the above-mentioned method of producing a tetrafluoroethylene polymer is dispersed in the aqueous medium.

The modified polytetrafluoroethylene aqueous dispersion of the invention is preferably an aqueous dispersion obtained after completion of the polymerization of tetrafluoroethylene in the above-mentioned steps (1) and (2) according to the method of producing a tetrafluoroethylene polymer mentioned above, wherein the tetrafluoroethylene polymer primary particles before undergoing such a subsequent step as coagulation or concentration are dispersed in an aqueous medium.

The polytetrafluoroethylene aggregate obtained by coagulating the modified polytetrafluoroethylene aqueous dispersion, followed by drying, generally occurs as a powder. The polytetrafluoroethylene coagulate showing a dielectric loss tangent at 12 GHz and a cylinder extrusion pressure at a reduction ratio of 1600 within the respective ranges given above generally is one having no history of being heated at or above the melting point of the polymer constituting the polytetrafluoroethylene coagulate.

When obtained by the method of producing a tetrafluoroethylene polymer of the invention, the modified polytetrafluoroethylene powder of the invention is one improved in electrical characteristics in the microwave band, in particular low in dielectric loss tangent, and also improved in moldability/processability.

The mechanisms by which the modified polytetrafluoroethylene powder of the invention produces such effects as mentioned above are not yet clear but are presumably as follows. Thus, each of the particles constituting the modified polytetrafluoroethylene powder of the invention in the stage of production of which a hydrocarbon or a fluorohydrocarbon is used as a chain transfer agent is considered to have a three layer structure mainly consisting of the core made of a modified PTFE, the shell made of a modified PTFE and the outer particle core made of a TFE homopolymer or a polymer modified to a lesser extent as compared with the core or shell; and, presumably, the fact that the core is made of a modified PTFE increases the sphericity of the particle, the fact that the shell is made of a modified PTFE improves the slippage of the particle and thereby the moldability of the powder as a whole is improved, and the fact that the outer particle core is lower in degree of modification than both the core and shell lowers the extent of modification of the powder as a whole, whereby the electrical characteristics are improved.

The polytetrafluoroethylene coagulate obtained by coagulation of the modified polytetrafluoroethylene aqueous dispersion of the invention, followed by drying and the modified polytetrafluoroethylene powder of the invention also have good electrical characteristics in the microwave band, are low in dielectric loss tangent, in particular, and are further improved in moldability/processability, presumably owing to the mechanisms mentioned above.

An additive for resins which comprises the above-mentioned modified polytetrafluoroethylene powder and modified polytetrafluoroethylene aqueous dispersion also constitutes an aspect of the present invention.

The modified polytetrafluoroethylene powder of the invention is excellent in handleability and noncoagulability and, when it is added to various resin materials, the efficiency of the addition operation is characteristically improved.

The above-mentioned additive for resins can be suitably added to such main component resins as engineering plastics so far known in the art, among others; when the modified polytetrafluoroethylene powder of the invention is used, a preferred addition level is lower than 2 parts by mass per 100 parts by mass of the main component resins and, when the modified polytetrafluoroethylene aqueous dispersion of the invention is used, a preferred addition level is such that the mass of the solid matter thereof amounts to 2 parts by mass per 100 parts by mass of the main component resins.

The above-mentioned additive for resins is to be added for the purpose of improving the slip characteristics or improving the flame retardancy and is excellent in slip characteristics and drip preventing performance.

A molded article obtained by molding/processing the above-mentioned modified polytetrafluoroethylene powder and modified polytetrafluoroethylene aqueous dispersion also constitutes an aspect of the present invention.

When the modified polytetrafluoroethylene powder is used, the above molding/processing is generally carried out by adding an extrusion aid according to the molding method, molding the compound by such a molding method as paste extrusion molding, ram extrusion molding or compression molding, followed by baking and further followed by gradual cooling; it may include subjecting the molded article obtained by the above-mentioned molding method to after-treatment such as skiving according to need.

When the modified polytetrafluoroethylene aqueous dispersion is used, the above molding/processing comprises applying the dispersion to a substrate by casting or impregnating a substrate with the dispersion by impregnation, and drying the substrate, followed by baking according to need. As the substrate, there may be mentioned, for example, polytetrafluoroethylene [PTFE]-made porous films, moldings made of other various polymers, sheets or plates made of a ceramic, aluminum, stainless steel or the like, and glass cloths. The above-mentioned baking is generally carried out at 360 to 400° C.

The above molded article is one obtained by the above molding/processing and includes extruded molded articles or compression molded articles or products derived from these molded articles by after-treatment, cast films and impregnated films or membranes, among others. The above molded article also includes pellets or masterbatches obtained by melt kneading the above modified polytetrafluoroethylene powder.

The molded article of the invention can be used in millimetric wave band exceeding 30 GHz and UHF (ultra high frequency) band below 3 GHz. Since, however, it can have a dielectric constant of not higher than 2.2 at 12 GHz and a dielectric loss tangent of not higher than $2.0 \times 10^{-4}$, it is particularly excellent in electrical characteristics in the microwave band covering 3 to 30 GHz.

The molded article of the invention can be suitably used in those fields of application where the dielectric loss is a problem and good paste extrusion moldability is required. Further, since the fluoropolymer used has a high thermal decomposition temperature and the molded article has good thermal stability comparable to the molded articles obtained by using a TFE homopolymer alone and, therefore, is hardly deteriorated even upon exposure to such thermal hysteresis event as plating or soldering, it can also be suitably used in those fields of application where solder reflow treatment is applied thereto. As such fields of application, there may be mentioned, for example, a covering material for coaxial cables, and connectors, printed circuit boards and the like which are required to be soldered.

A molding material obtained by the above-mentioned modified polytetrafluoroethylene powder and modified polytetrafluoroethylene aqueous dispersion, which is to be used for molding or manufacturing cable coverings, electric wire coverings, printed circuit boards, tubes or yarns, also constitutes an aspect of the present invention.

The above molding material may contain, in addition to the above-mentioned modified polytetrafluoroethylene powder and modified polytetrafluoroethylene aqueous dispersion, a pigment such as titanium oxide or cobalt oxide; a reinforcing material such as glass fibers or mica; a leveling agent, etc.

Effects of the Invention

The modified polytetrafluoroethylene powder, which has the constitution described hereinabove, is low in extrusion pressure on the occasion of molding, and the molded article obtained therefrom is low in dielectric loss tangent and can have good insulating properties.

The method of producing a tetrafluoroethylene polymer of the invention, which has the constitution described hereinabove, can give a tetrafluoroethylene polymer low in extrusion pressure on the occasion of molding and low in dielectric loss tangent.

BEST MODES FOR CARRYING OUT THE INVENTION

The following examples illustrate the invention specifically. These examples are, however, by no means limitative of the scope of the invention.

The physical properties shown in Table 2 were measured in the following manner.

(Method of Calculating the Mass Ratio Between the Tetrafluoroethylene Units in the Tetrafluoroethylene Polymers and the Units Derived from Perfluoro (Methyl Vinyl Ether) [PMVE] Used in Examples 3, 7 and 11 and Comparative Example 2)

Gas samples were collected from the gaseous phase portion in the autoclave just after the start of polymerization, just before additional modifier charging, just after the additional modifier charging and at the time of finishing the polymerization. Using a gas chromatograph (trademark: GC-14B, product of Shimadzu Corporation), each gas sample collected was analyzed, and the mass ratio between the TFE gas and modifier gas based on the peak area ratio between the tetrafluoroethylene [TFE] gas and modifier gas.

Based on the difference between the mass ratio between TFE gas and modifier gas at the start of polymerization and the mass ratio between them just before the additional modifier charging, the modifier gas consumption in the core formation was determined. Similarly, based on the difference between the mass ratio between TFE gas and modifier gas just after charging of the modifier gas as an additional modifier and the mass ratio between them at the end of reaction, the modifier gas consumption in the shell formation was calculated.

(Method of Determining the Degree of Modification of the Tetrafluoroethylene Polymer by the Modifier Used in Examples 1 to 2, Examples 4 to 11 and Comparative Examples 1 to 4)

In the course of polymerization of tetrafluoroethylene, polymer samples were collected just before additional modifier charging and analyzed, and the degree of modification of the core was determined. Then, for the tetrafluoroethylene polymer finally obtained was analyzed for determining the total degree of modification, and the degree of modification of the core was calculated referring to the degree of modification of the core.

The degree of modification by each modifier was calculated in the following manner.

As for the hexafluoropropylene-derived hexafluoropropylene unit content, the value (% by mass) obtained by multiplying the intensity ratio between the infrared absorption band at 983 cm$^{-1}$ and that at 935 cm$^{-1}$ by the factor 0.3 was used.

As for the perfluoro (propyl vinyl ether)-derived perfluoro (propyl vinyl ether) unit content, the value (% by mass) obtained by multiplying the intensity ratio between the infrared absorption band at 995 cm$^{-1}$ and that at 935 cm$^{-1}$ by the factor 0.14 was used.

As for the vinylic heterocyclic compound unit content, the value (% by mass) obtained by multiplying the intensity ratio between the infrared absorption band at 988 cm$^{-1}$ and that at 935 cm$^{-1}$ by the factor 0.1053 was used.

(Average Primary Particle Diameter)

Modified polytetrafluoroethylene dispersions were each adjusted to a solid content of 0.15% by mass and placed in a cell, and the transmittance of an incident light at 550 nm was measured. Separately, the number average primary particle diameter of each polymer species was calculated by measuring diameters in a fixed direction on a transmission electron photomicrograph. A working curve was constructed based on the thus-found correlation between the transmittance and the number average primary particle diameter. Then, the average primary particle diameter value of each sample was determined based on the working curve obtained and the transmittance of the sample as measured in the same manner as mentioned above.

(Standard Specific Gravity [SSG])

Using samples prepared in accordance with ASTM D 4895-89, SSG measurements were carried out by the water displacement method.

(Conditions for Preparing Sample Sheets for Dielectric Loss Tangent Measurement)

Each modified polytetrafluoroethylene powder was compression molded into a cylinder, 0.5-mm-thick sheets were cut out of this cylinder and baked in a hot air circulating type electric oven at 380° C. for 5 minutes and then allowed to cool to room temperature at a rate of cooling of 60° C./hour to give sample sheets.

(Dielectric Loss Tangent)

Using a network analyzer (Hewlett-Packard model H08510C), the resonance frequency and the change in Q value of each film prepared in the above manner were measured on a cavity resonator, and the dielectric loss tangent at 12 GHz was calculated as follows:

$$\tan \delta = (1 \times Q_u) \times \{1 + (W_2/W_1)\} - (P_c/\omega W_1)$$

$$\varepsilon_r = \left(\frac{c}{\pi \times L \times F_0}\right)^2 \times \left\{X^2 - Y^2\left(\frac{L}{2M}\right)^2\right\} + 1$$

$$X \tan X = (L/2M)Y \cos Y$$

$$X = \frac{L}{2}\sqrt{\varepsilon_r \times k_0^2 - k_r^2}$$

$$Y = M\sqrt{k_0^2 - k_r^2}$$

$$k_0 = \frac{\varpi}{c}$$

$$\varpi = 2\pi F_0$$

$$k_r = \frac{3.8317}{D/2}$$

$$Q_M = \frac{Q_L}{1 - 10^{(-Id/20)}}$$

$$Q_L = \frac{F_0}{F_1 - F_2}$$

$$W_1 = \frac{1}{8} \times \varepsilon_r \times \varepsilon_0 \times L \times \pi \times \varpi^2 \times \mu_0^2 \times J_1^2 \times J_0^2 \times \left(1 + \frac{\sin X}{2X}\right)$$

-continued $$W_2 = \frac{1}{4} \times \varepsilon_0 \times M \times \pi \times \left(1 - \frac{\sin 2Y}{2Y}\right) \times \varpi^2 \times \mu_0^2 \times J_1^2 \times J_0^2$$

$$P_C = P_1 + P_2 + P_3$$

$$P_1 = \frac{1}{2} \times Rs \times \frac{D}{2} \times L \times \pi \times \left(1 - \frac{\sin X}{2X}\right) \times \left(\frac{J_1 \times 2}{D}\right)^4 \times J_0^2$$

$$P_2 = \frac{1}{2} \times \left(\frac{-\cos X}{\sin Y}\right)^2 \times Rs \times \frac{D}{2} \times M \times \pi \times \left(1 - \frac{\sin 2Y}{2Y}\right) \times \left(\frac{J_1 \times 2}{D}\right)^4 \times J_0^2$$

$$P_3 = \frac{1}{2} \times \left(\frac{-\cos X}{\sin Y}\right)^2 \times Rs \times \pi \times \left(J_1 \times J_0 \times \frac{Y}{M}\right)^2$$

In the above formulas, the symbols have the following meanings:
D: Cavity resonator diameter (mm)
M: Cavity resonator one-side length (mm)
L: Sample length (mm)
e: Speed of light (m/s)
Id: Attenuation (dB)
$F_0$: Resonance frequency (Hz)
$F_1$: Upper frequency (Hz) at which the attenuation from the resonance point is 3 dB
$F_2$: Lower frequency (Hz) at which the attenuation from the resonance point is 3 dB
$\varepsilon_0$: Permittivity (H/m) of the vacuum
$\varepsilon_r$: Dielectric constant of the sample
$\mu_0$: Permeability of the vacuum (H/m)
Rs: Effective surface resistance ($\Omega$) with the reverse side roughness of the conductor cavity being taken into consideration
$J_0$: −0.402759
$J_1$: 3.83171

(Extrusion Pressure)

An extruder in accordance with ASTM D 4895 was used. First, 50.00 g of each modified polytetrafluoroethylene powder and 10.25 g of a hydrocarbon oil (trademark: Isopar G, product of Exxon Chemical Company) as an extrusion aid were mixed up in a glass bottle and the mixture was matured at room temperature (25±2° C.) for 1 hour.

Then, the cylinder of the extruder was filled with the above mixture, a load of 5.7 MPa was applied to the piston inserted into the cylinder and, after 1 minute of maintenance of that state, and immediately thereafter the mixture was extruded through the orifice at room temperature at a ram speed of 20 mm/minute. The value obtained by dividing the load (N) at the time when the pressure arrived at an equilibrium state during the extrusion operation by the sectional area of the cylinder was taken as the extrusion pressure (MPa).

(Extrudate Appearance)

The appearance of each extrudate obtained by the above paste extrusion was observed by the eye and evaluated according to the following criteria:
A: The extrudate obtained is continuous and shows no jetting.
B: The extrudate obtained is continuous but shows some jetting.
C: The extrudate obtained is continuous but shows considerable jetting.
D: No continuous extrudate can be obtained.

EXAMPLE 1

A 6-liter stainless steel (SUS316) autoclave equipped with a stainless steel (SUS316) anchor type stirrer and a jacket for temperature control was charged with 2960 g of deionized water, 120 g of paraffin wax and 4.4 g of ammonium perfluorooctanoate as a dispersant. Then, while heating the autoclave to 70° C., the system inside was deprived of oxygen by purging with nitrogen gas (three times) and then with tetrafluoroethylene [TFE] gas (two times). Thereafter, the inside pressure was raised to 0.73 MPa with TFE gas, stirring (280 rpm) was started, and the inside temperature was maintained at 70° C.

Then, 0.8 g of hexafluoropropylene [HFP] as an initial charge modifier was injected into the autoclave, followed by injection of 150 mg of disuccinoyl peroxide [DSP] dissolved in 20 g of deionized water and 11.1 mg of ammonium persulfate [APS] dissolved in 20 g of deionized water; the autoclave inside pressure was thus raised to 0.78 MPa.

At the time of arrival of the consumption of TFE by the reaction after addition of the polymerization initiator at 280 g (20% conversion), the feeding of TFE and stirring were discontinued. Then, the gas within the autoclave was gradually discharged (TFE discharging) until arrival of the inside pressure at atmospheric pressure and, thereafter, TFE was fed until arrival of the inside pressure at 0.78 MPa, stirring was again started at 280 rpm and the reaction was further allowed to proceed.

At the time of arrival of the consumption of TFE by the reaction at 1264 g (90% conversion), 5 g of HFP as an additional modifier and 1000 ml of methane gas as a chain transfer agent were respectively fed to the autoclave, and the reaction was continuously allowed to proceed.

Since, otherwise, the autoclave inside pressure would decrease with the progress of the reaction, tetrafluoroethylene was continuously fed throughout the whole reaction process to always maintain that pressure at 0.78 MPa. The rate of stirring was 280 rpm, and the reaction temperature was maintained at a constant level of 70° C.

At the time of arrival of the reaction-due consumption of TFE at 1400 g, the feeding of TFE was discontinued and the stirring was stopped. The gas within the autoclave was discharged until arrival at ordinary pressure and then the contents were taken out; the reaction was thus finished.

The modified polytetrafluoroethylene aqueous dispersion obtained had a solid content of 31.3% by mass and the average primary particle diameter was 0.29 μm.

The modified polytetrafluoroethylene aqueous dispersion obtained was diluted with deionized water to a solid concentration of about 15% by mass, the dilution was stirred vigorously until coagulation occurred, and the coagulate thus obtained was dried at 145° C. for 18 hours. After coagulate drying, the HFP unit content in the tetrafluoroethylene polymer obtained was measured and found to be 0.072% by mass. The modified polytetrafluoroethylene powder obtained had a standard specific gravity [SSG] of 2.168. The composition of the tetrafluoroethylene polymer obtained, the dielectric loss tangent and extrusion pressure of the modified polytetrafluoroethylene powder and the result of appearance evaluation of the extrudate are shown in Table 2.

EXAMPLE 2

A modified polytetrafluoroethylene powder was produced in the same manner as in Example 1 except that the chain transfer species and the amount thereof were changed as specified in Table 1.

EXAMPLE 3

A modified polytetrafluoroethylene powder was produced in the same manner as in Example 2 except that the initial charge modifier and additional modifier species and the amounts thereof were changed as specified in Table 1.

EXAMPLES 4 TO 6

Modified polytetrafluoroethylene powders were produced in the same manner as in Example 1 except that the chain transfer agent species and the amount thereof and the amount of the additional modifier were changed as specified in Table 1.

EXAMPLE 7

A modified polytetrafluoroethylene powder was produced in the same manner as in Example 1 except that the amount of disuccinoyl peroxide [DSP], the amount of ammonium persulfate [APS], the reaction temperature, the timing of TFE discharging, the initial charge modifier and additional modifier species and the amounts thereof were changed as specified in Table 1.

The composition of the thus-obtained tetrafluoroethylene polymer, such physical properties as standard specific gravity, dielectric loss tangent and extrusion pressure of the modified polytetrafluoroethylene powder and the result of appearance evaluation of the extrudate are shown in Table 2.

EXAMPLES 8 TO 10

Modified polytetrafluoroethylene powders were produced in the same manner as in Example 6 except that the initial charge modifier and/or additional modifier species and the amount thereof were changed as specified in Table 1.

EXAMPLE 11

A modified polytetrafluoroethylene powder was produced in the same manner as in Example 7 except that the gas within the autoclave was never discharged until completion of the reaction.

EXAMPLES 12 TO 13

Modified polytetrafluoroethylene powders were produced in the same manner as in Example 1 except that the chain transfer agent species and the amount thereof were changed as specified in Table 1.

COMPARATIVE EXAMPLE 1

A 6-liter stainless steel (SUS316) autoclave equipped with a stainless steel (SUS316) anchor type stirrer and a jacket for temperature control was charged with 2960 g of deionized water, 120 g of paraffin wax and 4.4 g of ammonium perfluorooctanoate as a dispersant. Then, while heating the autoclave to 85° C., the system inside was deprived of oxygen by purging with nitrogen (three times) and then with TFE gas (two times). Thereafter, the inside pressure was raised to 0.73 MPa with TFE gas, stirring (250 rpm) was started, and the inside temperature was maintained at 85° C.

Then, 0.1 g of HFP gas as an initial charge modifier was injected into the autoclave, followed by injection of 477 mg of DSP dissolved in 20 g of deionized water and 30 mg of APS dissolved in 20 g of deionized water; the autoclave inside pressure was thus raised to 0.78 MPa.

At the time of arrival of the consumption of TFE by the reaction at 1170 g (90% conversion), 0.44 g of HFP gas as an additional modifier and 20 ml of ethane gas as a chain transfer agent were respectively fed to the autoclave, and the reaction was continuously allowed to proceed.

Since, otherwise, the autoclave inside pressure would decrease with the progress of the reaction, TFE gas was continuously fed throughout the reaction process to always maintain that pressure at 0.78 MPa. The rate of stirring was 250 rpm, and the reaction temperature was maintained at a constant level of 85° C.

At the time of arrival of the reaction-due consumption of TFE at 1300 g, the feeding of TFE was discontinued and the stirring was stopped. The gas within the autoclave was discharged until arrival at ordinary pressure and then the contents were taken out; the reaction was thus finished.

The dispersion obtained had a solid content of 31.6% by mass and the average primary particle diameter was 0.28 μm.

The dispersion obtained was coagulated in the conventional manner, and the resin obtained was dried at 130° C. for 18 hours. Using the modified polytetrafluoroethylene powder obtained after drying, the HFP unit content in the tetrafluoroethylene polymer was measured and found to be 0.006% by mass. The modified polytetrafluoroethylene powder obtained had a SSG of 2.208.

TABLE 1

| | Disuccinoyl peroxide (DSP) [mg] | Ammonium persulfate (APS) [mg] | Reaction temperature [° C.] | Chain transfer agent Species | Amount added [ml] | Initial charge modifier Species | Amount added [g] | Additional modifier Species | Amount added [g] | Conversion of TFE at the time of TFE discharging [%] |
|---|---|---|---|---|---|---|---|---|---|---|
| Example 1 | 150 | 11.1 | 70 | Methane | 1000 | HFP | 0.8 | HFP | 5 | 20 |
| Example 2 | 150 | 11.1 | 70 | Ethane | 20 | HFP | 0.8 | HFP | 5 | 20 |
| Example 3 | 150 | 11.1 | 70 | Ethane | 20 | PMVE | 0.015 | PMVE | 3.7 | 20 |
| Example 4 | 150 | 11.1 | 70 | Propane | 10 | HFP | 0.8 | HFP | 5 | 20 |
| Example 5 | 150 | 11.1 | 70 | n-Buthane | 5 | HFP | 0.8 | HFP | 5 | 20 |
| Example 6 | 150 | 11.1 | 70 | iso-Buthane | 10 | HFP | 0.8 | HFP | 10 | 20 |
| Example 7 | 240 | 6 | 85 | iso-Buthane | 10 | PMVE | 0.1 | HFP | 10 | 10 |
| Example 8 | 150 | 11.1 | 70 | iso-Buthane | 10 | PPVE | 0.6 | HFP | 10 | 20 |
| Example 9 | 150 | 11.1 | 70 | iso-Buthane | 10 | PDD | 0.7 | HFP | 10 | 20 |
| Example 10 | 150 | 11.1 | 70 | iso-Buthane | 5 | HFP | 0.8 | HFP | 5 | 20 |
| Example 11 | 240 | 6 | 85 | iso-Buthane | 10 | PMVE | 0.1 | HFP | 10 | — |
| Example 12 | 150 | 11.1 | 70 | HFC-32 | 750 | HFP | 0.8 | HFP | 5 | 20 |
| Example 13 | 150 | 11.1 | 70 | HFC-134a | 750 | HFP | 0.8 | HFP | 5 | 20 |
| Comp. Ex. 1 | 477 | 30 | 85 | Ethane | 20 | HFP | 0.1 | HFP | 0.44 | — |
| Comp. Ex. 2 | 954 | 60 | 85 | Ethane | 20 | PMVE | 0.015 | HFP | 0.44 | — |
| Comp. Ex. 3 | 240 | 6 | 85 | iso-Buthane | 10 | HFP | 0.4 | HFP | 10 | — |
| Comp. Ex. 4 | 240 | 6 | 85 | Ethane | 20 | PFBE | 0.6 | HFP | 10 | — |

COMPARATIVE EXAMPLE 2

The reaction was carried out in the same manner as in Comparative Example 1 except that 0.015 g of PMVE was used as the initial charge modifier in lieu of 0.1 g of HFP gas and 954 mg of DSP and 60 mg of APS were used. Typical physical properties of the thus-obtained tetrafluoroethylene polymer and modified polytetrafluoroethylene powder and the result of evaluation of the extrudate appearance are shown in Table 2.

COMPARATIVE EXAMPLE 3

The reaction was carried out in the same manner as in Comparative Example 1 except that the rate of stirring was 280 rpm, 10 ml of isobutane gas was used as the chain transfer agent, 0.4 g of HFP gas was used as the initial charge modifier and DSP was used in an amount of 240 mg and APS in an amount of 6 mg.

COMPARATIVE EXAMPLE 4

The reaction was carried out in the same manner as in Comparative Example 1 except that 0.6 g of (perfluorobutyl) ethylene [PFBE] was used as the initial charge modifier in lieu of 0.1 g of HFP and DSP was used in an amount of 240 mg and APS in an amount of 6 mg.

Industrial Applicability

The modified polytetrafluoroethylene powder of the invention is useful as a material for use in manufacturing apparatus to be used in satellite communication equipment, cellular phone base stations and so forth, where microwaves are used, for example as a covering material for coaxial cables and the like, utilizing, for example, such characteristic features thereof as balanced electrical characteristics and moldability.

The invention claimed is:

1. A molded article comprising a tetrafluoroethylene polymer, said molded article having a dielectric constant of not higher than 2.2 at 12 GHz and a dielectric loss tangent at 12 GHz of not higher than $2.0 \times 10^{-4}$ for use in millimetric wave band applications exceeding 30 GHz, in UHF band applications below 3 GHz and in microwave band applications covering 3 to 30 GHz, said molded article being used as or in a cable covering, an electric wire covering, a printed circuit board, a tube or a yarn, said molded article obtained by molding/processing a modified polytetrafluoroethylene powder comprising a modified polytetrafluoroethylene, said modified polytetrafluoroethylene powder having a standard specific gravity of 2.158 to 2.189 and a cylinder extrusion pressure of not higher than 45 MPa at a reduction ratio of 1600, said modified polytetrafluoroethylene being modified at a specific degree of modification, said specific degree of modification being not lower than 0.01% by mass but lower than 0.1% by mass of the tetrafluoroethylene polymer, said tetrafluoroethylene polymer constituting a particle core and a particle shell, wherein the particle core is constituted of an inner particle core amount to 5 to 90% by mass of the tetrafluoroethylene polymer and an outer particle core contacting with the outer surface of said inner particle core,

TABLE 2

| | Modifier composition | | | | | | Average | | Polymer concentration | Dielectric loss | Moldability | |
| | As a whole | | Core | | Shell | | primary | Standard | | | Ex- | Ex- |
| | Species | Content [% by mass] | Species | Content [% by mass] | Species | Content [% by mass] | particle diameter [µm] | specific gravity [SSG] | (% by mass) after reaction | tangent tanδ [*10$^{-4}$] | trusion pressure [MPa] | trudate appearance |
|---|---|---|---|---|---|---|---|---|---|---|---|---|
| Example 1 | HFP | 0.072 | HFP | 0.034 | HFP | 0.038 | 0.29 | 2.168 | 31.3 | 1.88 | 34.7 | A |
| Example 2 | HFP | 0.076 | HFP | 0.037 | HFP | 0.039 | 0.29 | 2.169 | 30.3 | 1.87 | 37.8 | A |
| Example 3 | PMVE | 0.094 | PMVE | 0.001 | PMVE | 0.093 | 0.3 | 2.16 | 31.6 | 1.95 | 31.2 | A |
| Example 4 | HFP | 0.07 | HFP | 0.033 | HFP | 0.037 | 0.28 | 2.169 | 30.9 | 1.88 | 38.6 | A |
| Example 5 | HFP | 0.073 | HFP | 0.035 | HFP | 0.038 | 0.28 | 2.168 | 31.2 | 1.86 | 41.6 | A |
| Example 6 | HFP | 0.089 | HFP | 0.039 | HFP | 0.05 | 0.28 | 2.173 | 32.2 | 1.87 | 26.1 | A |
| Example 7 | PMVE/HFP | 0.005/0.052 | PMVE | 0.005 | HFP | 0.052 | 0.3 | 2.185 | 30.7 | 1.88 | 22.9 | A |
| Example 8 | PPVE/HFP | 0.028/0.055 | PPVE | 0.028 | HFP | 0.055 | 0.25 | 2.17 | 31.5 | 1.89 | 34.5 | A |
| Example 9 | PDD/HFP | 0.038/0.051 | PDD | 0.038 | HFP | 0.051 | 0.25 | 2.158 | 31.3 | 1.92 | 32.8 | A |
| Example 10 | HFP | 0.067 | HFP | 0.033 | HFP | 0.034 | 0.28 | 2.168 | 32 | 1.76 | 39.8 | A |
| Example 11 | PMVE/HFP | 0.007/0.053 | PMVE | 0.007 | HFP | 0.053 | 0.28 | 2.189 | 30.8 | 1.88 | 23.7 | A |
| Example 12 | HFP | 0.068 | HFP | 0.033 | HFP | 0.035 | 0.28 | 2.167 | 32.4 | 1.72 | 33.1 | A |
| Example 13 | HFP | 0.074 | HFP | 0.039 | HFP | 0.035 | 0.28 | 2.166 | 30.8 | 1.89 | 33.8 | A |
| Comp. Ex. 1 | HFP | 0.006 | HFP | 0.005 | HFP | 0.001 | 0.28 | 2.208 | 31.6 | 1.47 | 51.7 | C |
| Comp. Ex. 2 | PMVE/HFP | 0.001/0.003 | PMVE | 0.001 | HFP | 0.003 | 0.27 | 2.131 | 30.1 | 1.38 | 47.2 | C |
| Comp. Ex. 3 | HFP | 0.111 | HFP | 0.043 | HFP | 0.068 | 0.29 | 2.175 | 30.9 | 2.12 | 30.1 | A |
| Comp. Ex. 4 | PFBE/HFP | 0.036/0.054 | PFBE | 0.036 | HFP | 0.054 | 0.26 | 2.159 | 32.3 | 2.16 | 34.4 | B |

The data shown in Table 2 revealed that, in Examples 1 to 13, the both requirements, namely a dielectric loss tangent of not higher than $2.0 \times 10^{-4}$ and an extrusion pressure of not higher than 45 MPa, could be satisfied whereas, in Comparative Examples 1 and 2, in which the modifier amount on the whole particle basis was smaller, the dielectric loss tangent was small but the extrusion pressure was high.

On the other hand, in Comparative Example 3 where the modifier amount on the whole particle basis was large, it was revealed that the extrusion pressure lowered but the dielectric loss tangent increased.

said inner particle core contains fluoroolefin units derived from a fluoroolefin of the general formula (I):

$$CX^1X^2=CX^3(CF_2)_{n1}F \quad (I)$$

wherein $X^1$, $X^2$ and $X^3$ each represents hydrogen atom or fluorine atom and at least one of them represents fluorine atom, and n1 represents an integer of 1 to 5, fluoro(alkyl vinyl ether) units derived from a fluoro(alkyl vinyl ether) of the general formula (II):

$$F_2C=CFO(CF_2)_{n2}X^4 \quad (II)$$

wherein $X^4$ represents hydrogen atom or fluorine atom, and n2 represents an integer of 1 to 6 and/or vinylic heterocyclic compound units derived from a vinylic heterocyclic compound of the general formula (III):

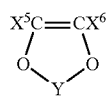

(III)

wherein $X^5$ and $X^6$ are the same or different and each represents hydrogen atom or fluorine atom and Y represents —$CR^1R^2$— in which $R^1$ and $R^2$ are the same or different and each represents fluorine atom, an alkyl group containing 1 to 6 carbon atoms or a fluoroalkyl group containing 1 to 6 carbon atoms at a total content level of not less than 0.0001% by mass but less than 0.1% by mass relative to the modified polytetrafluoroethylene polymer powder,
    a polymer constituting said outer particle core is free of the fluoroolefin units derived from the fluoroolefin of the general formula (I), the fluoro(alkyl vinyl ether) units derived from the fluoro(alkyl vinyl ether) of the general formula (II) and the vinylic heterocyclic compound units derived from the vinylic heterocyclic compound of the general formula (III), and
  wherein said particle shell contains the fluoroolefin units derived from the fluoroolefin of the general formula (I), the fluoro(alkyl vinyl ether) units derived from the fluoro(alkyl vinyl ether) of the general formula (II) and/or the vinylic heterocyclic compound units derived from the vinylic heterocyclic compound of the general formula (III) at a total content level of not less than 0.0001% by mass but less than 0.1% by mass relative to the modified polytetrafluoroethylene polymer powder, and
  wherein said particle shell is obtained by using a chain transfer agent which comprises at least one member selected from the group consisting of methane, ethane, butane, HFC-134a and HFC-32.

2. The molded article as claimed in claim 1, wherein the modified polytetrafluoroethylene powder has a cylinder extrusion pressure at a reduction ratio of 1600 is not higher than 35 MPa.

3. The molded article as claimed in claim 1,
  wherein a modified polytetrafluoroethylene constituting the modified polytetrafluorothylene powder is a tetrafluoroethylene copolymer obtained by polymerizing tetrafluoroethylene with an olefinic comonomer copolymerizable with tetrafluoroethylene,
  said olefinic comonomer is a fluoroolefin represented by the general formula (I):

$$CX^1X^2=CX^3(CF_2)_{n1}F \quad (I)$$

wherein $X^1$, $X^2$ and $X^3$ each represents hydrogen atom or fluorine atom and at least one of them represents fluorine atom, and n1 represents an integer of 1 to 5, a fluoro(alkyl vinyl ether) represented by the general formula (II):

$$F_2C=CFO(CF_2)_{n2}X^4 \quad (II)$$

wherein $X^4$ represents hydrogen atom or fluorine atom and n2 represents an integer of 1 to 6, and/or a vinylic heterocyclic compound represented by the general formula (III):

(III)

wherein $X^5$ and $X^6$ are the same or different and each represents hydrogen atom or fluorine atom and Y represents —$CR^1R^2$— in which $R^1$ and $R^2$ are the same or different and each represents fluorine atom, an alkyl group containing 1 to 6 carbon atoms or a fluoroalkyl group containing 1 to 6 carbon atoms,
  said modified polytetrafluoroethylene being modified at a specific degree of modification by containing at least one unit species selected from the group consisting of a fluoroolefin unit derived from said fluoroolefin represented by the general formula (I), a fluoro(alkyl vinyl ether) unit derived from said fluoro(alkyl vinyl ether) represented by the general formula (II) and a vinylic heterocyclic compound unit derived from said vinylic heterocyclic compound represented by the general formula (III).

4. The molded article as claimed in claim 1, further comprising an electric wire which is covered by said molded article.

5. The molded article as claimed in claim 4, allowing for transmission of a microwave band of 3 to 30 GHz over said molded article.

6. A coaxial cable comprising an electric wire and the molded article as claimed in claim 1 covering said electric wire.

7. The coaxial cable as claimed in claim 6, allowing for transmission of a microwave band of 3 to 30 GHz over said coaxial cable.

* * * * *